(12) United States Patent
Farrar

(10) Patent No.: US 6,573,572 B2
(45) Date of Patent: Jun. 3, 2003

(54) DAMASCENE STRUCTURE AND METHOD OF MAKING

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/984,776

(22) Filed: Oct. 31, 2001

(65) Prior Publication Data

US 2002/0048931 A1 Apr. 25, 2002

Related U.S. Application Data

(62) Division of application No. 09/648,465, filed on Aug. 28, 2000.

(51) Int. Cl.[7] .............................................. H01L 29/76
(52) U.S. Cl. ..................................................... 257/386
(58) Field of Search ................................ 257/396, 386, 257/758, 759; 438/622, 623

(56) References Cited

U.S. PATENT DOCUMENTS

| 5,976,968 A | 11/1999 | Dai |
| 6,060,404 A | 5/2000 | Ngo et al. |
| 6,063,711 A | 5/2000 | Chao et al. |
| 6,071,805 A | 6/2000 | Liu |
| 6,071,809 A | 6/2000 | Zhao |
| 6,100,184 A * | 8/2000 | Zhao et al. ................. 438/638 |
| 6,187,661 B1 * | 2/2001 | Lou ........................... 438/622 |
| 6,242,339 B1 * | 6/2001 | Aoi ............................ 438/623 |
| 6,243,339 B1 | 6/2001 | Aoi |
| 6,252,290 B1 | 6/2001 | Quek et al. |
| 6,268,283 B1 | 7/2001 | Huang |
| 6,323,125 B1 * | 11/2001 | Soo et al. .................... 438/645 |
| 6,436,808 B1 * | 8/2002 | Ngo et al. ................... 438/623 |

* cited by examiner

Primary Examiner—David Nelms
Assistant Examiner—Thao Le
(74) Attorney, Agent, or Firm—Dickstein Shapiro Morin & Oshinsky LLP

(57) ABSTRACT

A damascene structure with a plurality of low dielectric constant insulating layers acting as etch stops is disclosed. The selected low dielectric constant materials have similar methods of formation and similar capacities to withstand physical and thermal stress. In addition, the etchant used for each low dielectric constant insulating layer has a very small etching rate relative to the other low dielectric constant insulating layers. Thus, the low dielectric constant materials act as insulating layers through which trenches and vias are formed.

17 Claims, 8 Drawing Sheets

DAMASCENE STRUCTURE AND METHOD OF MAKING

This application is a division of application Ser. No. 09/648,465 filed Aug. 28, 2000.

FIELD OF THE INVENTION

The present invention relates to semiconductor devices and methods of making such devices. More particularly, the invention relates to a method of forming damascene structures.

BACKGROUND OF THE INVENTION

The integration of a large number of components on a single integrated circuit (IC) chip requires complex interconnects. Ideally, the interconnect structures should be fabricated with minimal signal delay and optimal packing density. The reliability and performance of integrated circuits may be affected by the qualities of their interconnect structures.

Advanced multiple metallization layers have been used to accommodate higher packing densities as devices shrink below sub-0.25 micron design rules. One such metallization scheme is a dual damascene structure formed by a dual damascene process. The dual damascene process is a two-step sequential mask/etch process to form a two-level structure, such as a via connected to a metal line situated above the via.

As illustrated in FIG. 1, a known dual damascene process begins with the deposition of a first insulating layer 14 over a first level interconnect metal layer 12, which in turn is formed over or within a semiconductor substrate 10. A second insulating layer 16 is next formed over the first insulating layer 14. An etch stop layer 15 is typically formed between the first and second insulating layers 14, 16. The second insulating layer 16 is patterned by photolithography with a first mask (not shown) to form a trench 17 corresponding to a metal line of a second level interconnect. The etch stop layer 15 prevents the upper level trench pattern 17 from being etched through to the first insulating layer 14.

As illustrated in FIG. 2, a second masking step followed by an etch step are applied to form a via 18 through the etch stop layer 15 and the first insulating layer 14. After the etching is completed, both the trench 17 and the via 18 are filled with metal 20, which is typically copper (Cu), to form a damascene structure 25, as illustrated in FIG. 3.

If desired, a second etch stop layer, such as stop layer 29 of FIG. 4, may be formed between the substrate 10 and the first insulating layer 14 during the formation of a dual damascene structure 26. In any event, and in contrast to a single damascene process, the via and the trench are simultaneously filled with metal. Thus, compared to the single damascene process, the dual damascene process offers the advantage of process simplification and low manufacturing cost.

Dual damascene processes such as the ones described above pose significant problems. One of the problems is caused by the use of one or more etch stop layers. The etch stop layers 15, 25 prevent the damascene patterns 17, 18 from extending into or through the underlying layers 14, 10. Although the advantages of using the etch stop layers are significant, the process is complex since separate depositions are required for the etch stop layers.

In addition, the most commonly used etch stop material, silicon nitride ($Si_3N_4$), has a rather high dielectric constant (k) (approximately 7), which does not satisfy anymore the requirement of resistance-capacitance delay regarding the parasitic capacitance generated by an intermetal insulating layer. As integrated circuits become denser, it is increasingly important to minimize stray capacitance between the metal layers. This is accomplished by using intermetal insulating layers that have a low dielectric constant, such as, for example, organic dielectric materials. Silicon nitride does not satisfy the requirement of small stray capacitance of advanced damascene structures.

Accordingly, there is a need for an improved damascene process which reduces production costs and increases productivity. There is also a need for a damascene process that does not require etch stop layers, as well as a method for decreasing the stray capacitance between the metal layers of damascene structures.

SUMMARY OF THE INVENTION

The present invention provides a method for fabricating a damascene interconnect structure in a semiconductor device. According to one aspect of the invention, productivity can be increased since fewer processing steps are required. According to another aspect of the invention, the use of high dielectric etch stop material may be avoided, so as to reduce or minimize stray capacitance.

In an exemplary embodiment, a plurality of low dielectric constant materials are selected with similar methods of formation, as well as with similar capacities to withstand physical and thermal stress. The low dielectric constant materials act as insulating layers through which trenches and vias are subsequently formed according to damascene processing. Since the low dielectric constant materials are selected so that the etchant available for each one has only a small etch rate relative to the other low dielectric constant materials, the plurality of low dielectric constant materials act as etch stops during the fabrication of damascene structures. This way, the etch stop layers employed in the prior art are eliminated and the number of fabrication steps is reduced.

Additional advantages of the present invention will be more apparent from the detailed description and accompanying drawings, which illustrate preferred embodiments of the invention.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has a semiconductor surface. The term should be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a "substrate" in the following description, previous process steps may have been utilized to form regions or junctions in or on the base semiconductor or foundation.

The term "metal" is intended to include not only elemental metal, but also metal with other trace metals or in various alloyed combinations with other metals as known in the art, as long as such alloy retains the physical and chemical properties of the metal. The term "metal" is also intended to include oxides of such metals.

The present invention provides a method for fabricating a damascene interconnect structure in which a plurality of low dielectric constant materials are selected with similar methods of formation, as well as with similar capacities to withstand physical and thermal stress. The low dielectric constant materials act as insulating layers through which trenches and vias are subsequently formed.

Figure 1:
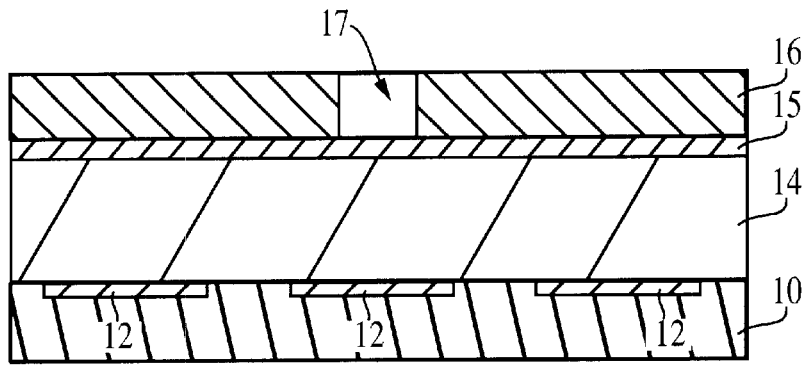
FIG. 1 is a cross sectional view of a semiconductor device at a preliminary stage of production.
Figure 2:
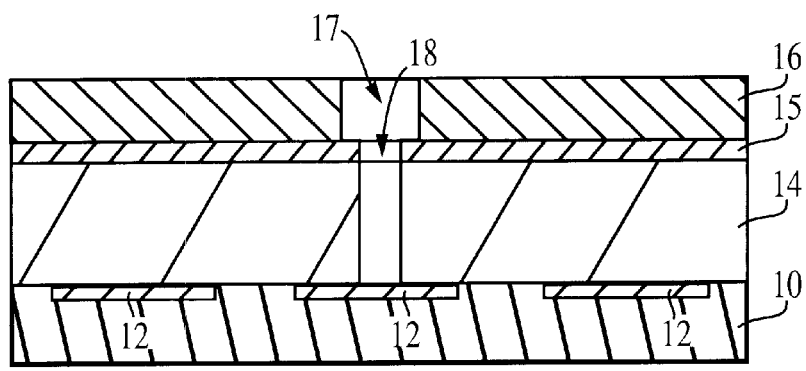
FIG. 2 is a cross sectional view of the semiconductor device of FIG. 1 at a subsequent stage of production.
Figure 3:
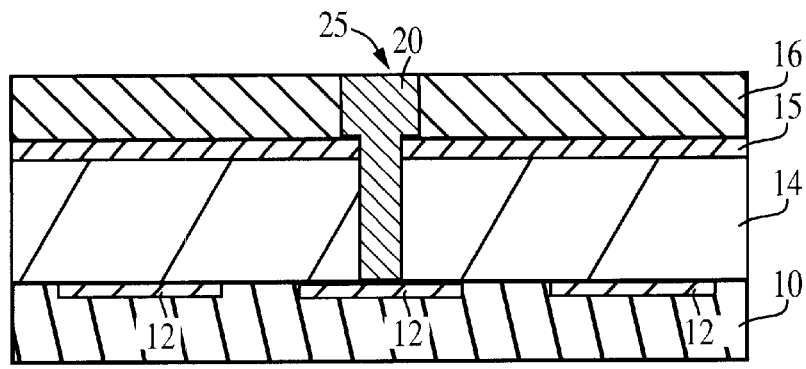
FIG. 3 is a cross sectional view of the semiconductor device of FIG. 2 at a subsequent stage of production.
Figure 4:
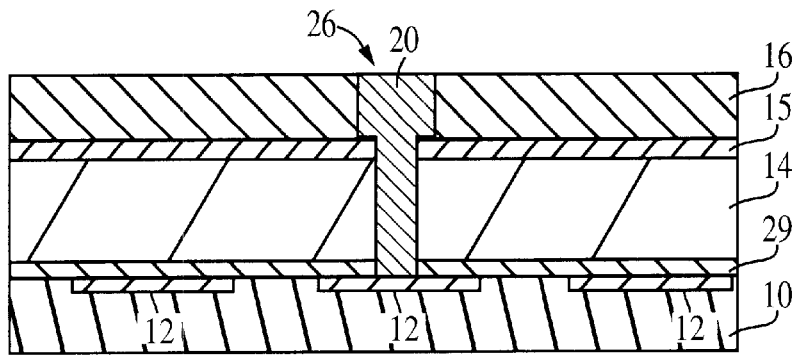
FIG. 4 is a cross sectional view of another semiconductor device.
Figure 5:
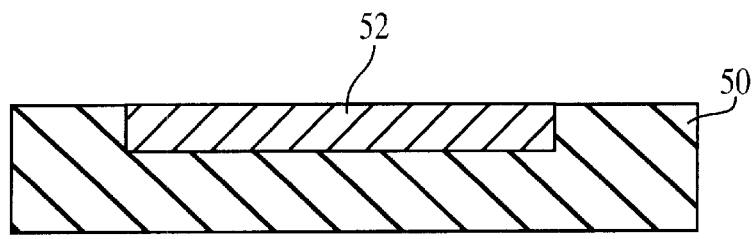
FIG. 5 is a cross sectional view of a semiconductor device at a preliminary stage of production and in accordance with a first embodiment of the present invention.

Referring now to the drawings, where like elements are designated by like reference numerals, FIG. 5 depicts a portion of a semiconductor substrate 50 on or within which a metal layer 52 has been formed. The metal layer 52 represents a lower metal interconnect layer which is to be later interconnected with an upper metal interconnect layer. The metal layer 52 may be formed of copper (Cu), but other conductive materials, such as tungsten (W) or aluminum (Al) and their alloys, may be used also.

Figure 6:
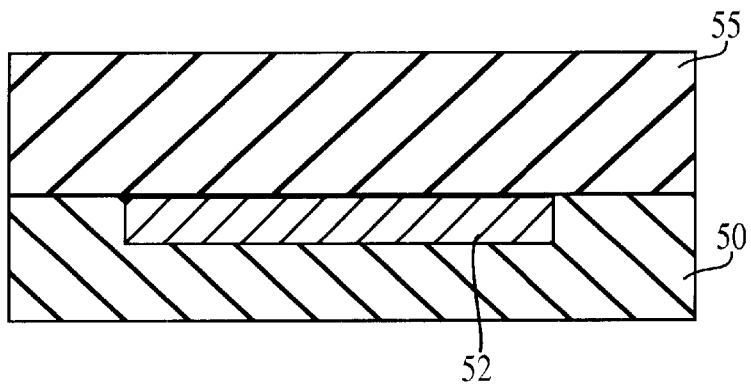
FIG. 6 is a cross sectional view of the semiconductor device of FIG. 5 at a subsequent stage of production.

Referring now to FIG. 6, a first intermetal insulating layer 55 is formed overlying the substrate 50 and the metal layer 52. In a preferred embodiment of the present invention, the first intermetal insulating layer 55 is blanket deposited by spin coating to a thickness of about 2,000 Angstroms to 15,000 Angstroms, more preferably about 6,000 10,000 Angstroms. The first intermetal insulating layer 55 may be cured at a predefined temperature, depending on the nature of the material. Other known deposition methods, such as sputtering by chemical vapor deposition (CVD), plasma enhanced CVD (PECVD), or physical vapor deposition (PVD), may be used also for the formation of the first intermetal insulating layer 55, as desired.

The first intermetal insulating layer 55 may be formed of a low dielectric constant organic material such as, for example, polyimide, spin-on-polymers (SOP), flare, polyarylethers, parylene, polytetrafluoroethylene, benzocyclobutene (BCB) or SILK. Alternatively, the first intermetal insulating layer 55 may be formed of an inorganic material with a low dielectric constant such as, for example, fluorinated silicon oxide (FSG), hydrogen silsesquioxane (HSQ) or NANOGLASS. The present invention is not limited, however, to the above-listed materials and other organic and inorganic materials with low dielectric constant may be used, especially ones whose dielectric constant (k) is lower than that of silicon oxide ($SiO_2$), which is approximately 4.0.

Figure 7:
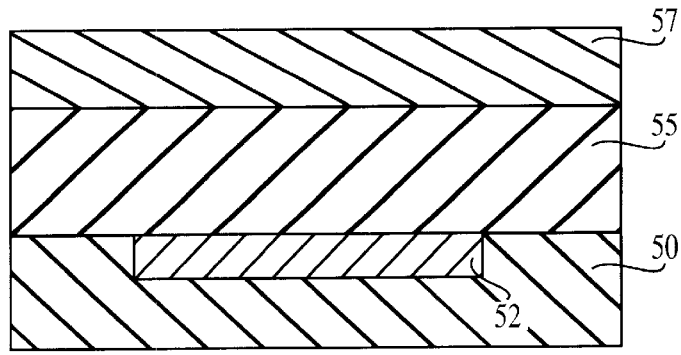
FIG. 7 is a cross sectional view of the semiconductor device of FIG. 6 at a subsequent stage of production.

Next, as illustrated in FIG. 7, a second intermetal insulating layer 57 is formed overlying the first intermetal insulating layer 55 and below a metal layer that will be formed subsequently. The second intermetal insulating layer 57 may be formed, for example, by spin coating to a thickness of about 2,000 Angstroms to about 15,000 Angstroms, more preferably of about 6,000–10,000 Angstroms. Following deposition, the second intermetal insulating layer 57 is cured at a predefined temperature, depending, again, on the nature and specific characteristics of the insulating material. Other deposition methods, such as the ones mentioned above with reference to the formation of the first intermetal insulating layer 55, may be used also.

The material of choice for the second intermetal insulating layer 57 is also a low dielectric constant organic or inorganic material, with a dielectric constant lower than 4.0, as the ones listed above with reference to the first intermetal insulating layer 55. However, as discussed in more detail below, the two intermetal insulating layers 55, 57 and the etch chemistries used to selectively remove these intermetal insulating layers may be physically and functionally related to each other. As such, the two insulating layers 55, 57 may be deposited in a similar manner and by similar methods. In addition, the insulating layers 55, 57 are preferably compatible with each other in the sense that each of them may be capable of withstanding stress levels which will be later induced as a result of various processes and during the use of the IC device. Further, each material should be capable of withstanding the maximum temperature required in the processing of the other one.

In a preferred embodiment of the present invention, two compatible materials for the two intermetal insulating layers 55, 57 are SILK (organic material with k of approximately 2.65 at 100 kHz) and NANOGLASS (inorganic material with k of approximately 3.5 at 100 kHz). Both SILK and NANOGLASS can be applied by spin coating and both are capable of withstanding similar stress levels, as well as the processing temperature of each other. Further, both SILK and NANOGLASS may be individually etched by a respective etchant which, while readily etching one insulating material, will have only a very small, negligible etch rate for the other insulating material.

Another example of two compatible low dielectric constant materials is a foamed polyimide (as the organic component with k in the range of 2.0 to 3.0, depending upon the degree of porosity) and hydrogen silsesquioxane (HSQ) (as the inorganic component with k in the range of 2.3 to 3.0). However, other combinations may also be employed. Further, two low dielectric constant organic materials, as well as two low dielectric constant inorganic materials may be used also, as long as both materials retain compatible physical and chemical properties. Thus, the present invention is not limited to the use of the above-mentioned combinations, and other compatible low dielectric constant materials may be used also, especially those whose dielectric constants are lower than 4.0.

Figure 8:
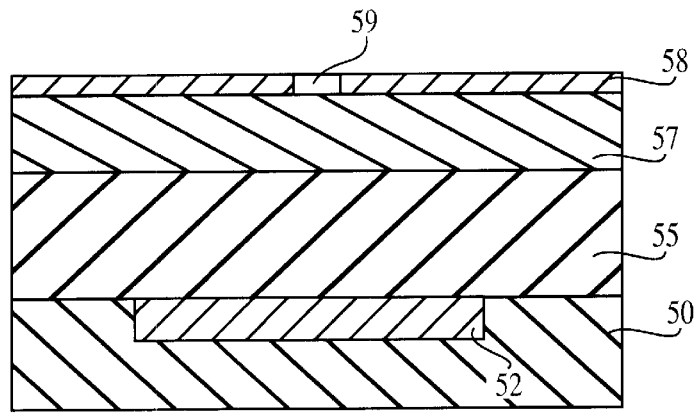
FIG. 8 is a cross sectional view of the semiconductor device of FIG. 7 at a subsequent stage of production.
Figure 9:
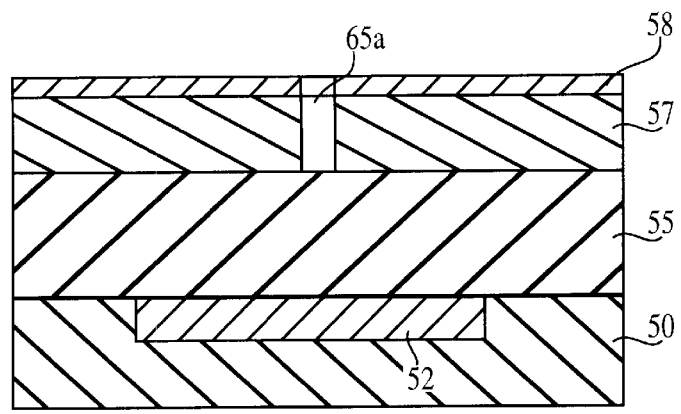
FIG. 9 is a cross sectional view of the semiconductor device of FIG. 8 at a subsequent stage of production.
Figure 10:
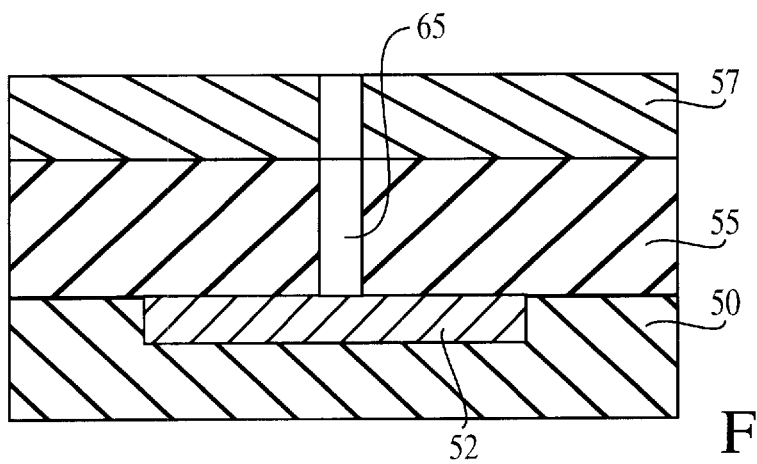
FIG. 10 is a cross sectional view of the semiconductor device of FIG. 9 at a subsequent stage of production.

As shown in FIG. 8, a first photoresist layer 58 is formed over the second intermetal insulating layer 57 to a thickness of about 100 to 120 Angstroms. The first photoresist layer 58 is then patterned with a mask (not shown) having images of a via pattern 59. Thus, a via 65a may be formed, as shown in FIG. 9, by etching through the photoresist layer 58 and into the second intermetal insulating layer 57. The etchant may be selected in accordance with the characteristics of the second insulating material 57. The etchant (not shown) will selectively etch the second insulating material 57 until it reaches the first insulating material 55. Then, the etch chemistry is changed, and a second etchant is employed to selectively etch the first intermetal insulating layer 55 through to the metal layer 52. Thus, after the removal of the first photoresist layer 58, via 65 is formed into the first intermetal insulating layer 55, as illustrated in FIG. 10.

In a preferred embodiment of the present invention, which employs the SILK/NANOGLASS combination, the first etchant (for etching through the second intermetal insulating NANOGLASS layer 57) may contain a chlorine (Cl) plasma. The second etchant (for selectively etching the first intermetal insulating SILI layer 55) may employ oxygen ($O_2$) plasma.

Figure 11:
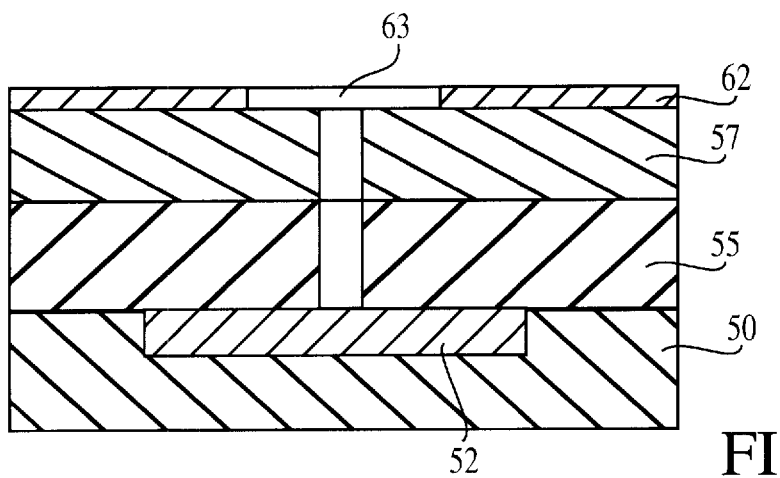
FIG. 11 is a cross sectional view of the semiconductor device of FIG. 10 at a subsequent stage of production.
Figure 12:
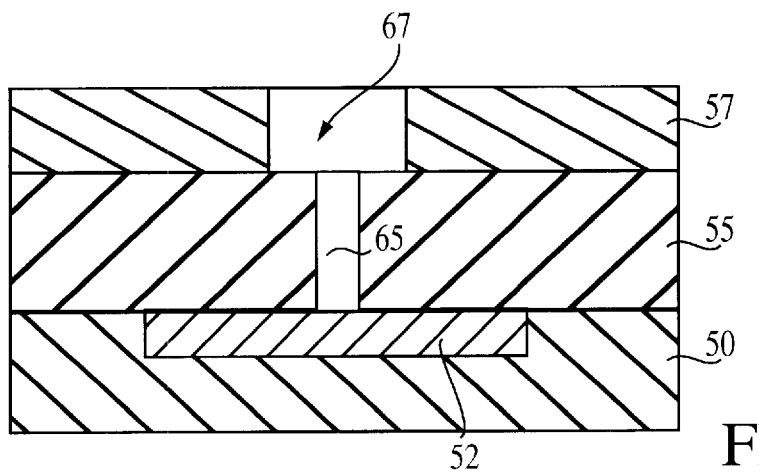
FIG. 12 is a cross sectional view of the semiconductor device of FIG. 11 at a subsequent stage of production.

After the formation of the via 65 through the first intermetal insulating layer 55, a trench 67 (FIG. 12) may be formed by photolithography. As such, a second photoresist layer 62 (FIG. 11) is formed over the second intermetal insulating layer 57 to a thickness of about 100 to 120 Angstroms and then patterned with a mask (not shown) having images of a trench pattern 63. The trench pattern 63 is then etched into the second intermetal insulating layer 57 to form trench 67, as shown in FIG. 12. The thickness of the first intermetal insulating layer 55 defines the thickness of the via 65 (FIGS. 10–12). The thickness of the second intermetal insulating layer 57 defines the thickness of the trench 67 (FIG. 12).

The etching of the trench 67 is accomplished by employing, for example, the first etchant (used for forming the via 65a (FIG. 9) through the second insulating material 57) until the etching reaches the first insulating material 55. Thus, the etchant for forming the trench 67 (FIG. 12) through the second intermetal insulating NANOGLASS layer 57 may include chlorine plasma.

Figure 13:
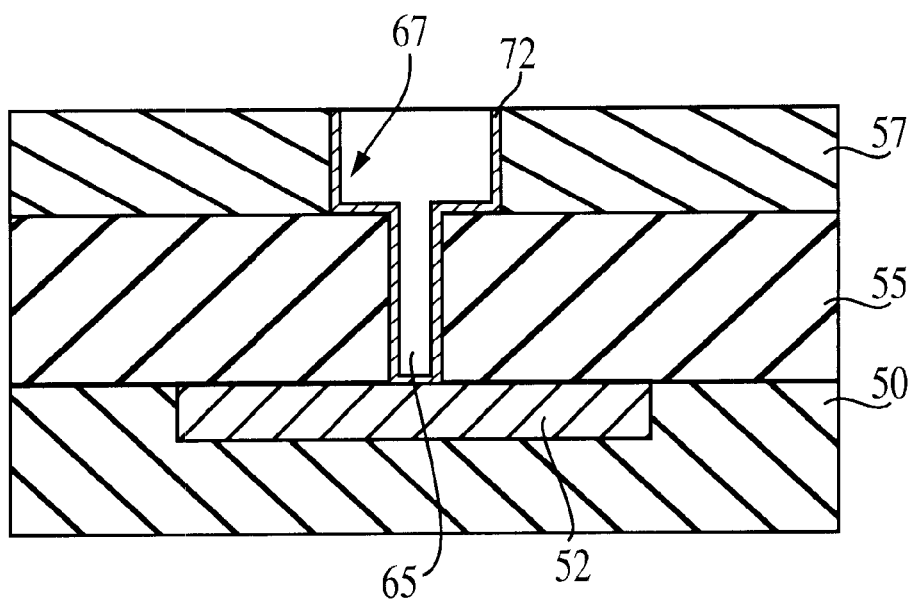
FIG. 13 is a cross sectional view of the semiconductor device of FIG. 12 at a subsequent stage of production.

Subsequent to the formation of trench 67, the second photoresist layer 62 is removed so that further steps to create the dual damascene structure 100 (FIG. 15) may be carried out. As such, a barrier layer 72 (FIG. 13) is formed on the via 65 and the trench 67, by CVD, PVD, sputtering or evaporation, to a thickness of about 50 Angstroms to about 200 Angstroms, more preferably of about 100 Angstroms.

Preferred materials for the barrier layer 72 are metals, such as titanium (Ti), zirconium (Zr), tungsten (W), or hafnium (Hf), or metal compounds, such as tantalum nitride (TaN) or silicon nitride ($Si_3N_4$). If desired, the barrier layer 72 may be formed of refractory metal compounds, such as refractory metal nitrides (for example TiN and HfN), refractory metal carbides (for example TiC or WC), or refractory metal borides (for example TiB or MoB). In any event, the barrier layer 72 suppresses the diffusion of the metal atoms from the subsequently deposited conductive material (FIG. 14), while offering a low resistivity and low contact resistance between the metal of the metal layer 52 and the barrier layer 72, and between the subsequently deposited conductive material (FIG. 14) and the barrier layer 72.

Although in a preferred embodiment of the invention the barrier layer 72 is simultaneously deposited in both the via 65 and the trench 67, the invention is not limited to this embodiment. Thus, the barrier layer 72 may be deposited first in the via 65 before the formation of the trench 67, and then in the trench 67 after its respective formation. In this embodiment, the barrier layer 72 may be formed of a first barrier material corresponding to the via 65 and of a second barrier material corresponding to the trench 67. The first and second barrier materials may be similar or different, depending on the characteristics of the IC device.

Figure 14:
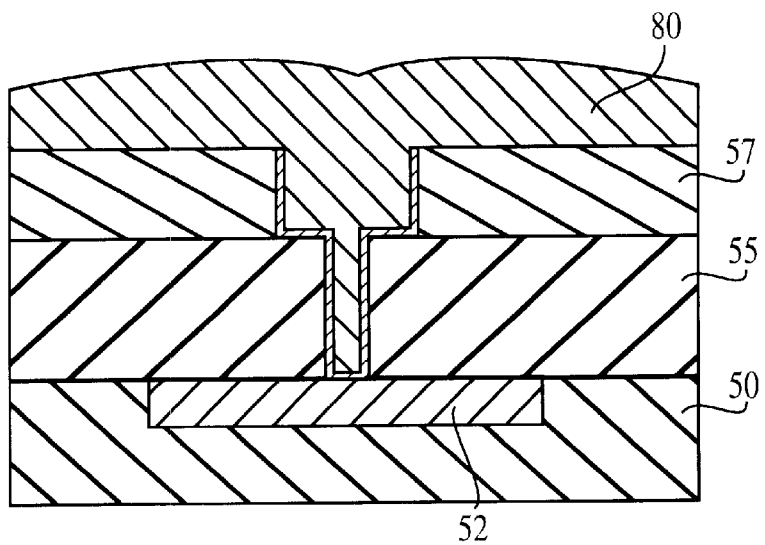
FIG. 14 is a cross sectional view of the semiconductor device of FIG. 13 at a subsequent stage of production.

As illustrated in FIG. 14, a conductive material 80 is next deposited to fill in both the via 65 and the trench 67. In the preferred embodiment, the conductive material 80 comprises either copper, tungsten or aluminum, but it must be understood that other materials may be used also. In any event, the conductive material 80 may be blanket deposited by a known PVD, CVD, or a combination of these techniques to fill in both the via 65 and the trench 67. Alternatively, the conductive material 80 may be deposited by a plating technique.

Figure 15:
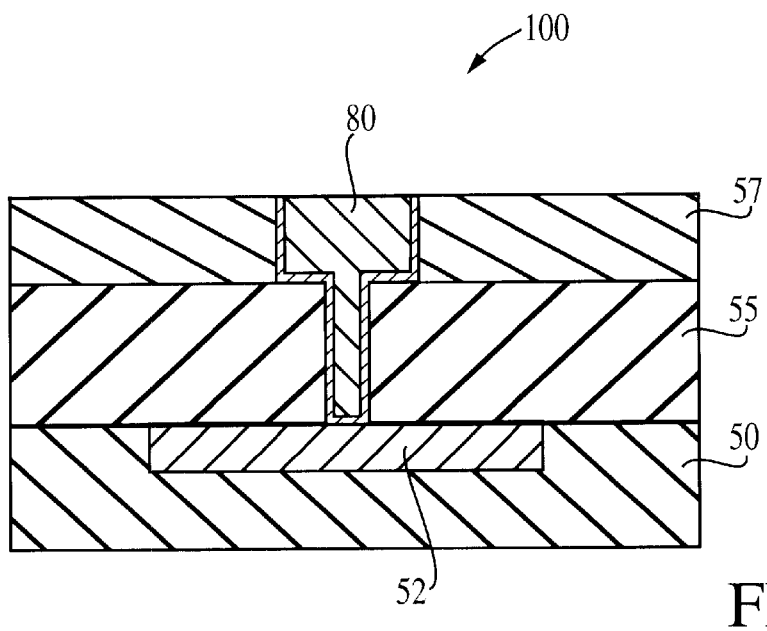
FIG. 15 is a cross sectional view of the semiconductor device of FIG. 14 at a subsequent stage of production.

After the deposition of the conductive material 80, excess metal formed above the surface of the second insulating material 57 may be removed by either an etching or a polishing technique to form the dual damascene structure 100 illustrated in FIG. 15. In a preferred embodiment of the present invention, chemical mechanical polishing (CMP) is used to polish away excess conductive material above the second insulating material 57 and the trench level. This way, the second insulating material 57 acts as a polishing stop layer when CMP is used.

Figure 16:
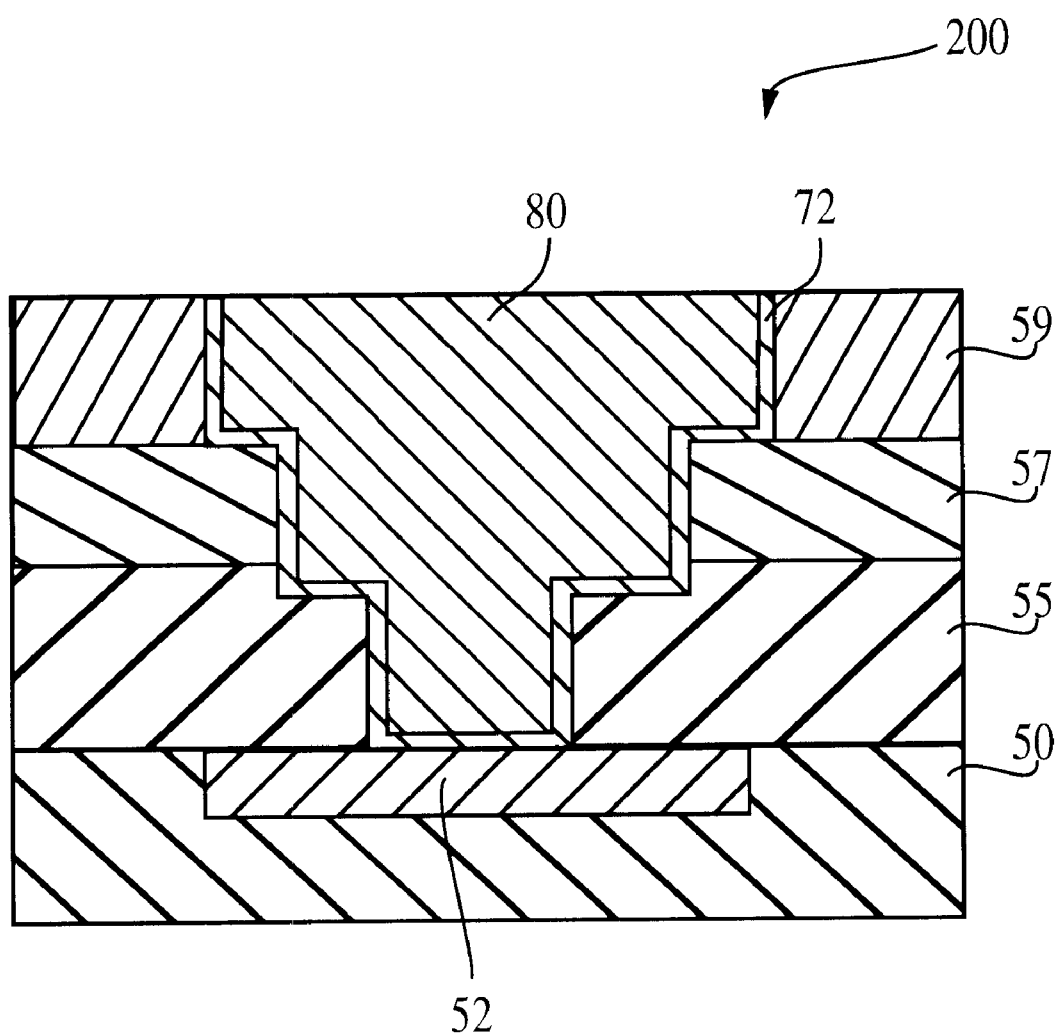
FIG. 16 is a cross sectional view of a semiconductor device constructed in accordance with a second embodiment of the present invention.

Although only one dual damascene structure 100 is shown in FIG. 15, it must be readily apparent to those skilled in the art that in fact any number of such dual damascene structures may be formed on the substrate 50. Also, although the exemplary embodiment described above refers to the formation of a dual damascene structure 100, the invention is further applicable to other types of damascene structures, for example, single or triple damascene structures, depending on the number of low dielectric constant insulating layers formed over the substrate 50. For example, FIG. 16 illustrates a triple damascene structure 200 with three low dielectric constant insulating layers 55, 57, 59 formed over the substrate 50 and in which vias and trenches are filled simultaneously with the conductive material 80. Further, the invention is not limited to the use of SILK and NANOGLASS, but may be used with other compatible organic and/or inorganic materials with dielectric constants lower than 4.0.

In addition, further steps to create a functional memory cell may be carried out. Thus, additional multilevel interconnect layers and associated dielectric layers could be formed to create operative electrical paths from the dual damascene structure 100 to a source/drain region (not shown) of the substrate 50.

Figure 17:
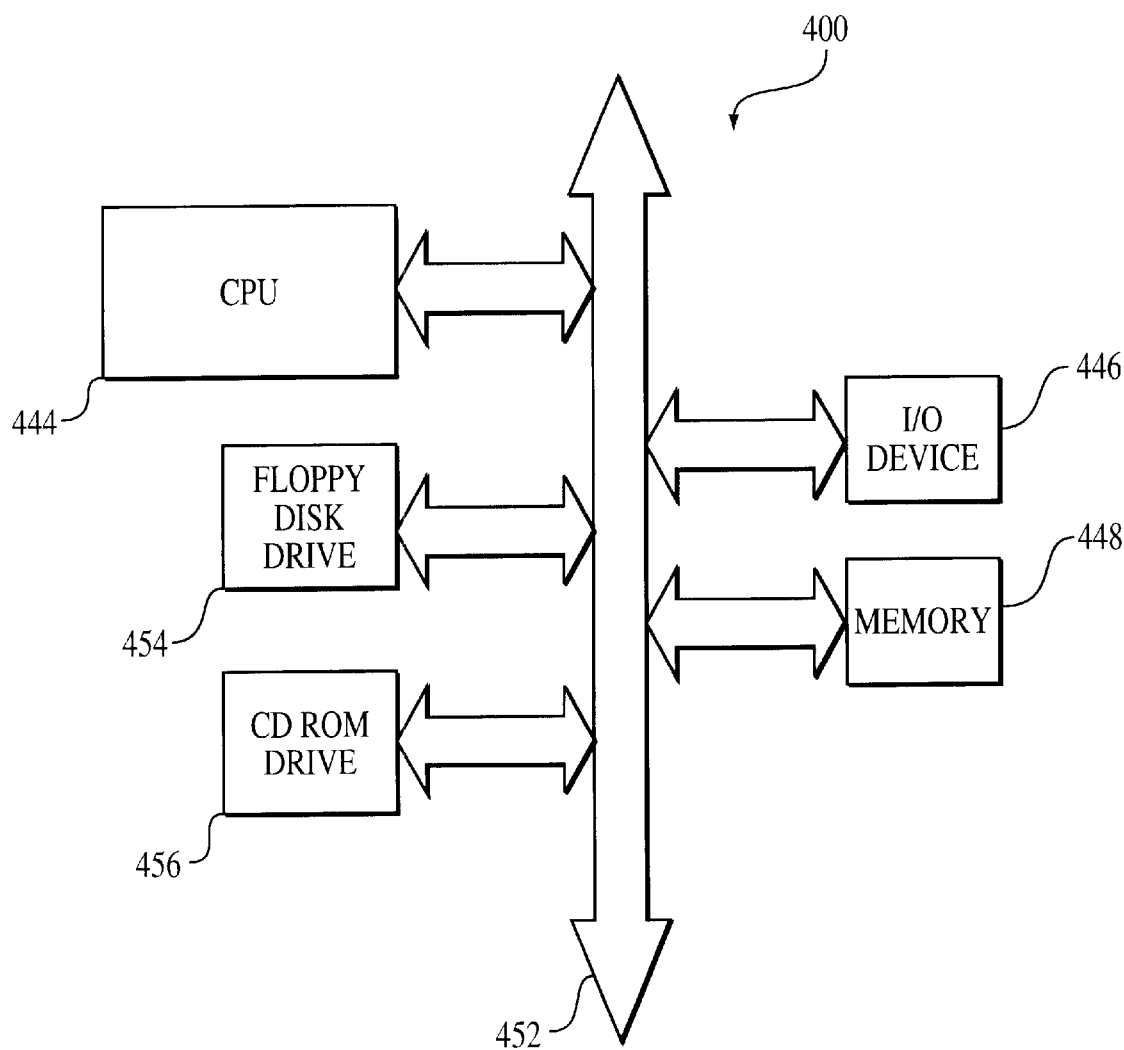
FIG. 17 illustrates a computer system having a memory cell with a dual damascene structure according to the present invention.

A typical processor-based system 400 which includes a memory circuit 448, for example a DRAM, containing dual damascene structures according to the present invention is illustrated in FIG. 17. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes one or more dual damascene structures 100. If desired, the memory 448 may be combined with the processor, e.g. CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A dual damascene structure, comprising:
    a substrate;
    a first low dielectric constant insulating layer located over said substrate;
    a via filled with a conductive material, said via being situated within said first low dielectric constant insulating layer;
    a second low dielectric constant insulating layer located over and in contact with said first low dielectric constant insulating layer;
    a trench filled with said conductive material, said trench being situated within said second low dielectric constant insulating layer and extending to said via.

2. The dual damascene structure of claim 1, wherein said first low dielectric constant insulating layer is a low dielectric constant organic material layer.

3. The dual damascene structure of claim 2, wherein said low dielectric constant organic material layer is formed of a material selected from the group consisting of polyimide, spin-on-polymers, flare, polyarylethers, parylene, polytetrafluoroethylene, benzocyclobutene and SILK.

4. The dual damascene structure of claim 1, wherein said first low dielectric constant insulating layer is a low dielectric constant inorganic material layer.

5. The dual damascene structure of claim 4, wherein said inorganic material layer is formed of a material selected from the group consisting of fluorinated silicon oxide, hydrogen silsesquioxane and NANO GLASS.

6. The dual damascene structure of claim 1, wherein said first low dielectric constant insulating layer has a thickness of about 2,000 to 15,000 Angstroms.

7. The dual damascene structure of claim 1, wherein said second low dielectric constant insulating layer is a low dielectric constant organic material layer.

8. The dual damascene structure of claim 7, wherein said low dielectric constant organic material layer is formed of a material selected from the group consisting of polyimide, spin-on-polymers, flare, polyarylethers, parylene, polytetrafluoroethylene, benzocyclobutene and SILK.

9. The dual damascene structure of claim 1, wherein said second low dielectric constant insulating layer is a low dielectric constant inorganic material layer.

10. The dual damascene structure of claim 9, wherein said inorganic material layer is formed of a material selected from the group consisting of fluorinated silicon oxide, hydrogen silsesquioxane and NANOGLASS.

11. The dual damascene structure of claim 1, wherein said second low dielectric constant insulating layer has a thickness of about 2,000 to 15,000 Angstroms.

12. The dual damascene structure of claim 1, wherein said conductive material is formed of a material selected from the group consisting of copper, copper alloy, gold, gold alloy, silver, silver alloy, tungsten, tungsten alloy, aluminum, and aluminum alloy.

13. The dual damascene structure of claim 1, wherein said first low dielectric constant insulating layer is a SILK layer and said second low dielectric constant insulating layer is a NANOGLASS layer.

14. The dual damascene structure of claim 1, wherein said first low dielectric constant insulating layer is a foamed polyimide layer and said second low dielectric constant insulating layer is a hydrogen silsesquioxane layer.

15. The dual damascene structure of claim 1, wherein said substrate is a semiconductor substrate.

16. The dual damascene structure of claim 1, wherein said first and second low dielectric constant insulating layers are formed of different materials which can be selectively etched relative to each others.

17. A processor-based system, comprising:
    a processor; and
    an integrated circuit coupled to said processor, at least one of said processor and integrated circuit including a damascene structure, said damascene structure comprising a first low dielectric constant insulating layer with a via formed within said first low dielectric constant insulating layer and extending to at least a portion of a metal layer provided within a semiconductor substrate, and a second low dielectric constant insulating layer over and in contact with said first low dielectric constant insulating layer with a trench formed within said second low dielectric constant insulating layer and extending to said via.

* * * * *

UNITED STATES PATENT AND TRADEMARK OFFICE
CERTIFICATE OF CORRECTION

PATENT NO. : 6,573,572 B2  
DATED : June 3, 2003  
INVENTOR(S) : Paul A. Farrar

It is certified that error appears in the above-identified patent and that said Letters Patent is hereby corrected as shown below:

Column 1,  
Line 5, after "2000" insert -- , which is hereby incorporated by reference. --

Column 4,  
Line 4, after "6,000" insert -- to --

Signed and Sealed this

Seventh Day of June, 2005

JON W. DUDAS  
*Director of the United States Patent and Trademark Office*